(12) United States Patent
Pan et al.

(10) Patent No.: US 8,377,316 B2
(45) Date of Patent: Feb. 19, 2013

(54) STRUCTURE AND METHOD FOR CREATING SURFACE TEXTURE OF COMPLIANT COATINGS ON PIEZO INK JET IMAGING DRUMS

(75) Inventors: David H. Pan, Rochester, NY (US); T. Edwin Freeman, Woodstock, NY (US)

(73) Assignee: Xerox Corporation, Norwalk, CT (US)

( * ) Notice: Subject to any disclaimer, the term of this patent is extended or adjusted under 35 U.S.C. 154(b) by 784 days.

(21) Appl. No.: 12/432,868

(22) Filed: Apr. 30, 2009

(65) Prior Publication Data
US 2010/0279078 A1 Nov. 4, 2010

(51) Int. Cl.
*B32B 3/00* (2006.01)
*C23F 1/00* (2006.01)
*G03F 7/00* (2006.01)

(52) U.S. Cl. .......... 216/8; 216/10; 216/24; 216/49; 216/51; 216/102; 430/314; 430/323; 428/195.1

(58) Field of Classification Search .............. None
See application file for complete search history.

(56) References Cited

U.S. PATENT DOCUMENTS

| | | | | |
|---|---|---|---|---|
| 4,365,549 A * | 12/1982 | Fotland et al. | ........... | 347/127 |
| 4,538,156 A | 8/1985 | Durkee | | |
| 4,551,406 A * | 11/1985 | Schaedlich et al. | ........ | 430/119.6 |
| 4,731,647 A | 3/1988 | Kohashi | | |
| 4,792,510 A * | 12/1988 | Kumano et al. | ........... | 430/65 |
| 4,822,631 A * | 4/1989 | Beaudet | ........... | 427/469 |
| 4,833,530 A | 5/1989 | Kohashi | | |
| 5,099,256 A | 3/1992 | Anderson | | |
| 5,290,591 A * | 3/1994 | Lussi et al. | ........... | 427/202 |
| 5,372,697 A * | 12/1994 | Akutsu et al. | ........... | 205/50 |
| 5,681,572 A * | 10/1997 | Seare, Jr. | ........... | 424/400 |
| 6,030,748 A * | 2/2000 | Nishimiya et al. | ........... | 430/271.1 |
| 6,843,945 B1 * | 1/2005 | Lee et al. | ........... | 264/49 |
| 6,899,419 B2 | 5/2005 | Pan | | |
| 6,923,533 B2 | 8/2005 | Pan | | |
| 7,041,897 B2 | 5/2006 | Herzog | | |
| 8,060,174 B2 * | 11/2011 | Simpson et al. | ........... | 600/345 |
| 2001/0014473 A1 * | 8/2001 | Rieser et al. | ........... | 435/297.1 |
| 2002/0001608 A1 * | 1/2002 | Polson et al. | ........... | 424/426 |
| 2002/0082638 A1 * | 6/2002 | Porter et al. | ........... | 606/195 |
| 2002/0084248 A1 * | 7/2002 | Kong et al. | ........... | 216/35 |
| 2003/0006534 A1 * | 1/2003 | Taboas et al. | ........... | 264/401 |
| 2006/0140843 A1 * | 6/2006 | Sung et al. | ........... | 423/351 |
| 2006/0270923 A1 * | 11/2006 | Brauker et al. | ........... | 600/345 |
| 2008/0193739 A1 * | 8/2008 | Dickey et al. | ........... | 428/317.9 |
| 2008/0246580 A1 * | 10/2008 | Braun et al. | ........... | 338/20 |
| 2008/0269366 A1 * | 10/2008 | Shaffer et al. | ........... | 521/134 |
| 2009/0246285 A1 * | 10/2009 | Stellacci et al. | ........... | 424/490 |
| 2010/0256746 A1 * | 10/2010 | Taylor et al. | ........... | 623/1.42 |
| 2011/0287272 A1 * | 11/2011 | Elia | ........... | 428/458 |

* cited by examiner

*Primary Examiner* — Allan Olsen
(74) *Attorney, Agent, or Firm* — Ronald E. Prass, Jr.; PRASS LLP

(57) ABSTRACT

This is structure and method for providing a textured surfaced that can be used in a plurality of systems including ink jet printing. In ink jet printing, the textured surface of this invention controls ink drawback and significantly improves image quality. The textured surface has an average roughness, $R_a$, of about 0.2 to 1.5 microns, a texture density of about $10^4$-$10^7$ pits per $cm^2$, a texture size of about 0.5-5 microns, and a texture depth of about 0.5-10 microns.

8 Claims, 5 Drawing Sheets

STRUCTURE AND METHOD FOR CREATING SURFACE TEXTURE OF COMPLIANT COATINGS ON PIEZO INK JET IMAGING DRUMS

This invention relates to a marking or imaging system and, more specifically, to a system, structure or process for producing an image-receiving surface for an ink jet printing system.

BACKGROUND

While, for clarity, the present process will be described in relation to a drum or substrate useful in ink jet technology, it should be understood that this process can be used to produce any substrate where supplying of drum maintenance fluid and coalescing of liquids in contact therewith is a concern. The present process and method can be described in relation to a fusing surface or any surface that requires the application of a thin film of release fluid.

Ink jet printers are known which comprise: an ink source, a printing head connected to the ink source for projecting droplets of ink under the control of electrical input signals representative of information to be printed, a printing medium e.g., a sheet or strip of paper located in the paths of the projected ink droplets and an arrangement for providing relative motion between the printing head and the printing medium. While such printers have enjoyed substantial commercial success, they are not without several inherent difficulties. For example, known ink jet printers tend to produce inconsistent printed copies. Ink jet printing systems have been employed in the prior art such as those disclosed in U.S. Pat. Nos. 4,538,156; 4,731,647; 4,833,530; 5,099,256, 6,899, 419; 6,923,533, and 7,014,897. All of these patents are incorporated by reference into the present disclosure.

Generally, in ink jet printing, liquid is supplied from a solvent supply source to a recording head which is responsive to a modulation signal from a control circuit to apply an ink droplet to a drum or writing surface. Generally, an intermediate transfer surface is used which is a liquid layer that is applied to a drum but may also be a web, platen or any other suitable receiving surface. The drum can comprise a metal such as aluminum, nickel or iron phosphate or mixtures thereof coated with elastomers such as Viton or Teflon (trademarks of dupont), Tecnoflon P59 (a trademark of Dow). Fluoroelastomers, perfluoroelastomers, silicone rubber and polybutadiene, plastics including but not limited to polytetrafluorethylene loaded with polyphenylene sulfide, thermoplastics such as polyethylene, nylon and FEP, thermosets such as acetals, or ceramics could be employed as long as the exposed surface is sufficiently rigid to deform the transferred image-forming ink when the final receiving medium passes between it and the transfer and fixing roller and sufficiently smooth so as not to interfere with the ability of the intermediate transfer surface or liquid layer to support the image-forming ink. The preferred drum material is anodized aluminum and a preferred elastomer is Viton®.

The imaging drum for future high-speed piezo ink jet printers comprises this noted compliant fluoroelastomer coating over an aluminum core. The surface texture of such a coating is an important consideration to enable pinning of individual ink droplets for high quality imaging. Smooth, low surface energy, low thermal conductivity surfaces create conditions that allow ink droplets the energy and time to move and coalesce on the surface of the drum. This phenomenon has been referred to as ink drawback and is more pronounced at high temperature. It reduces image quality and manifests itself as areas void of ink or mottled areas in the final image. For example, a continuous line of a given width may print as a randomly broken line of varying width or a solid area may print with an objectionable level of random areas void of ink.

This invention is an innovative method for texturing the surface of compliant coatings such as fluoroeslastomers of Viton GF and Tecnoflon P959 on aluminum piezo ink jet print drums to a specific pre-determined texture in order to prevent ink drawback and maintain image quality. Smooth, low energy, homogeneous surfaces inhibit droplet pinning and lead to drawback or a coalescence of individual ink droplets on the compliant surface. This phenomenon reduces image quality and manifests itself as areas void of ink of mottled areas in the final image. For example, a continuous line of a given width may print as a randomly broken line of varying width or a sole area may print with an objectionable level of random areas void of ink.

Examples of bases include magnesium oxide (MgO), calcium carbonate ($CaCO_3$), calcium hydroxide ($Ca(OH)_2$), potassium carbonate ($K_2CO_3$) and the like. Etching of the drum surface with an acid such as acetic acid will lead to a reaction to form a water-soluble salt of the particular base and water which can then be removed by washing the drum in water.

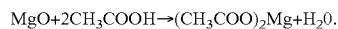

$$MgO + 2CH_3COOH \rightarrow (CH_3COO)_2Mg + H_2O.$$

SUMMARY

Higher drum surface texture has been shown in this invention to control ink drawback. This, it is believed, is due to the contact angle hystresis caused by the roughness and heterogeneity of the drum surface and it helps pin the drops on the drum. The present invention provides a chemical etching method to introduce roughness and heterogeneity at the surface of compliant drum coatings such as fluoroelastomers of Viton GF and Tecnoflon P959 on piezo ink jet print drums to a specific pre-determined texture which will prevent ink drawback and maintains image quality. The method in one embodiment generally entails the use of dispersing a reactive filler into the elastomer matrix coating a receiving surface with this material and subsequently removing the filler material from the region of the coating surface via a chemical reaction. Another embodiment involves coating a receiving surface with a photoresist layer, placing a mask over this photoresist, the mask having pre-determined openings, passing UV rays through these openings to provide corresponding openings in the photoresist layer and receiving surface and subsequently removing the remaining photoresist layer not exposed to UV rays to provide a textured receiving surface or drum. Removal of the filler by chemical means leaves a texture determined by the size of the filler particles. Plasma and other methods of etching could also be used for etching the drum in order to impart a highly textured surface as described herein.

As above noted, elastomeric coatings on the ink jet imaging drum have a low surface energy which causes the ink drops to retract and coalesce on the surface. This creates image defects on the transferred print such as broken lines and incomplete fill areas. It is known that roughening the surface helps minimize the retraction, presumably due to pinning the ink meniscus at the surface micro-imperfections. This invention suggests a way to create this micro-roughness in two steps: (a) mix a chemically reactive filler in the fluoroelastomer and coat the drum, and (b) chemically react with the filler particles to form water soluble precipitates that can be rinsed away leaving microvoids in their place. The disclosed method could be attractive for applications beyond imaging drums, e.g. fuser and pressure rolls, especially when the desired texture is a relatively smooth surface with occasional pits.

This invention provides an innovative method for texturing the surface of compliant coatings such as fluoroelastomers of Viton GF and Tecnoflon P959 on aluminum piezo ink jet print drums to a specific pre-determined texture in order to prevent ink drawback and maintain image quality. Smooth, low energy, homogeneous surfaces inhibit droplet pinning and lead to drawback or a coalescence of individual ink droplets on the compliant surface. This phenomenon reduces image quality and manifests itself as areas void of ink or mottled areas in the final image. For example, a continuous line of a given width may print as a randomly broken line of varying width or a solid area may print with an objectionable level of random areas void of ink.

Examples of bases include magnesium oxide (MgO), calcium carbonate ($CaCO_3$), calcium hydroxide ($Ca(OH)_2$), potassium carbonate ($K_2CO_3$) and mixtures thereof. Etching of the drum surface with an acid such as acetic acid will lead to a reaction to form a water-soluble salt of the particular base and water which can then be removed by washing the drum in water. $MgO+2CH_3COOH \rightarrow (CH_3COO)_2Mg+H_2O$.

Any suitable bases useful in this invention include oxides of Group IIA-VA metal and transition metal and mixtures thereof.

Magnesium oxide (MgO), calcium hydroxide ($Ca(OH)_2$), and calcium carbonate ($CaCO_3$) are preferred bases since high-textured drum surfaces were obtained using these two bases in the present process. The surfaces produced by the process of the present invention have the following characteristics:

Density of texture about $10^4$ to about $10^7$ pits per $cm^2$
Size of texture about 0.5 to about 5 microns
Depth of texture about 1 to about 10 microns

DETAILED DISCUSSION OF DRAWINGS AND PREFERRED EMBODIMENTS

Figure 1:
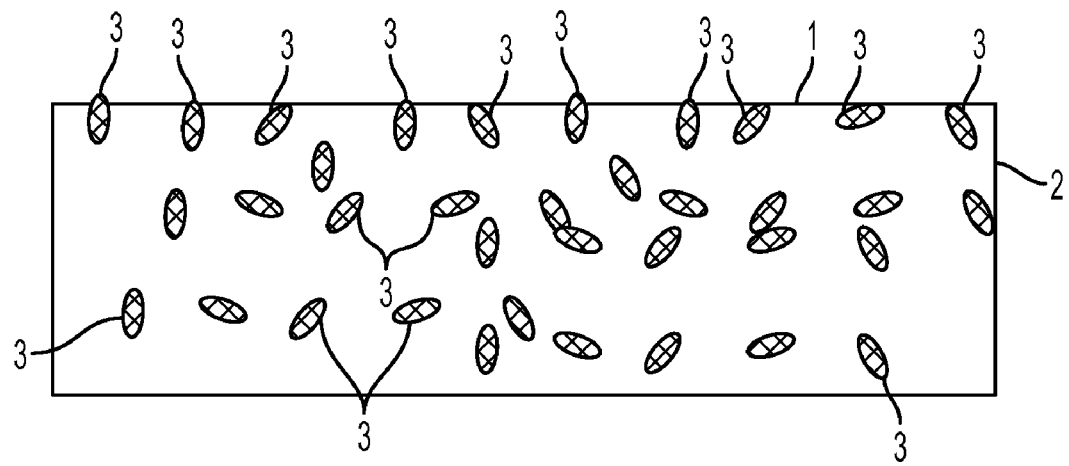
FIG. 1 illustrates the surface of a coating on a substrate (not shown) before chemical etching.
Figure 2:
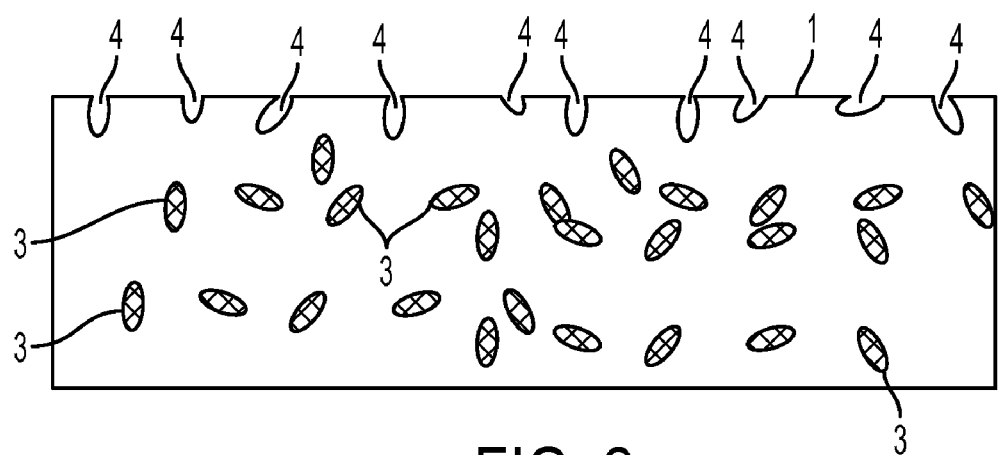
FIG. 2 illustrates the surface texture of a coating on a substrate (not shown) after the acetic acid etch.

In FIGS. 1 and 2, to a 150 g solution of Viton of 16% (w/v) Viton GF in methyl isobutyl ketone (MIBK), 3.6 g (15 pph) MgO and 0.24 g (1 pph) $Ca(OH)_2$ were added and the bases such as MgO, $Ca(OH)_2$, $CaCO_3$ or $K_2CO_3$ dispersed by adding steel shots and roll milling over night. A coating of the dispersion was prepared on stainless steel sheet after addition of 5 pph VC-50 curative, and cured. The surface 1 of the cured film 2 on stainless steel was sanded to expose the MgO particles 3, with 400 grit sand paper, after which the film 2 was placed in 50% glacial acetic acid for one hour. The film 2 was then washed with distilled water and dried. FIG. 1 shows the surface of the film 2 before chemical etching while FIG. 2 illustrates the surface 1 texture after etching. There is evidence of, as shown in FIG. 2 at pit locations 4, higher texture due to the removal of MgO particles 3 as a result of the etching process. Such pits are generated with a size and a depth characteristic of MgO particles or washed away filler particles. The density of surface pits is characteristic of reactive base or filler concentrations in the coating.

Figure 3A:
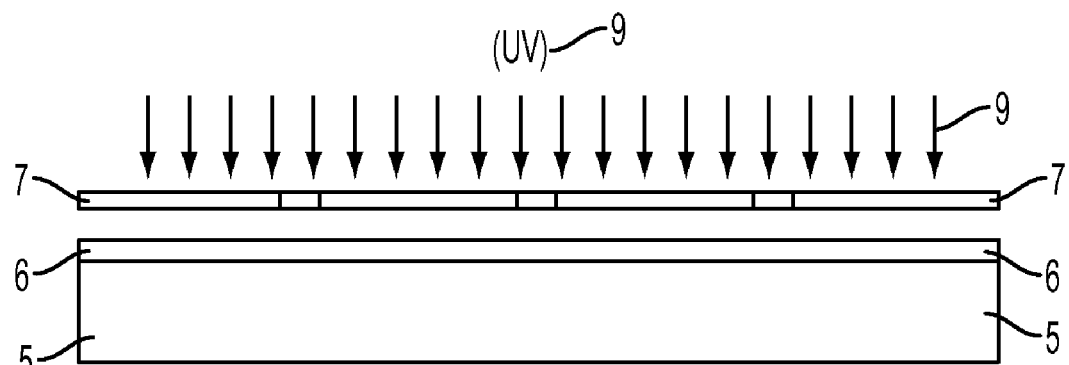
FIG. 3A to 3D illustrates the surface texture of a metallic drum generated by using a photoresist method.
Figure 3B:
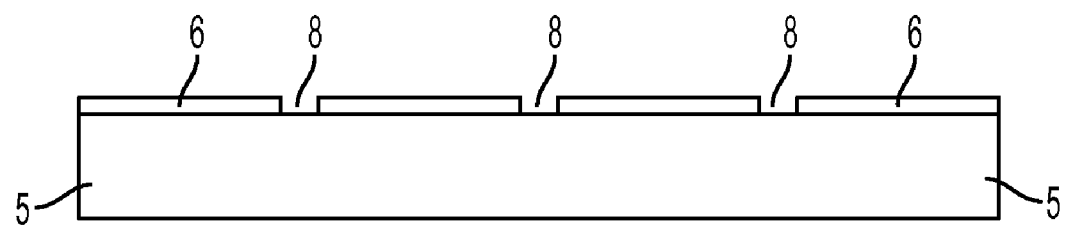
Figure 3C:
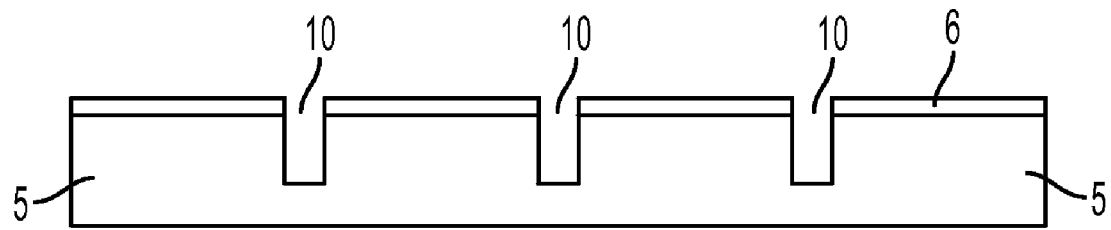
Figure 3D:
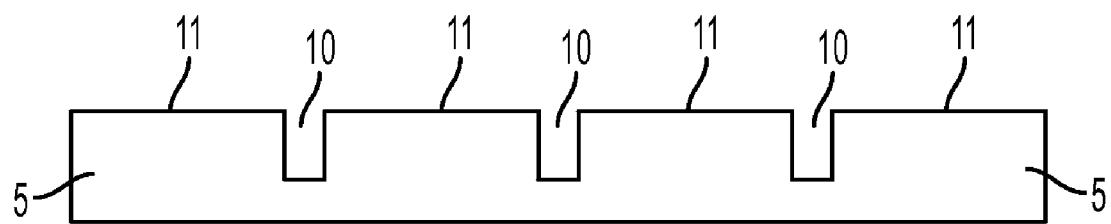

FIG. 3A, in one embodiment of this invention, illustrates a metallic or elastomer surface of an imaging drum 5 coated with a photoresist layer 6. A UV 9 mask 7 is also shown in FIG. 3A. After exposure through a mask 7, uncovered hole areas 8 are generated by removal of parts of the exposed photoresist 6 as shown in FIG. 3B. FIG. 3C depicts the pits 10 created by reactive acid etching. For example, some base metals can react with acid and the resulting salt is dissolved in the acid bath. If the imaging drum 5 is already coated with an elastomer, the pits 10 in the coating 6 can be created, for example, by using reactive ion etching method. The depth of the pits 10 can be controlled by the exposure time to the acid bath. FIG. 3D shows the last step of the process where the photoresist coating that covers the non-etchable areas is removed and a textured drum of a metallic or elastomer receiving surface 5 is provided thereby. The photoresist comprises a material of polymethylmethacrylate or polymethylglutarimide or diazonaphthoquinone/Novolac resin (a phenol formaldehyde resin) or SU-8 (an epoxy based photoresist). The mask is made up of a material impervious to UV rays. While either positive or negative photoresist would work in this embodiment, a positive photoresist is preferred.

Figure 4A:
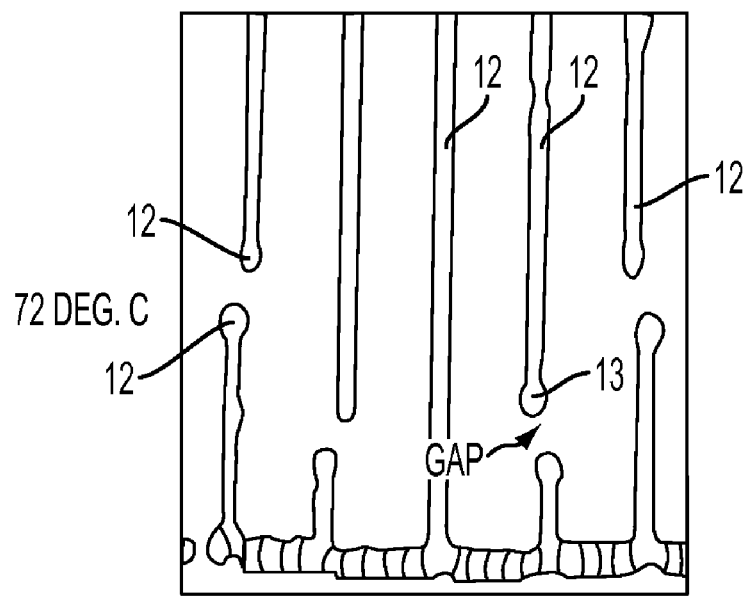
FIGS. 4A to 4D show side-by-side comparisons of ink drawback between etched surfaces of the present invention and non-etched original drum surfaces of the prior art.
Figure 4B:
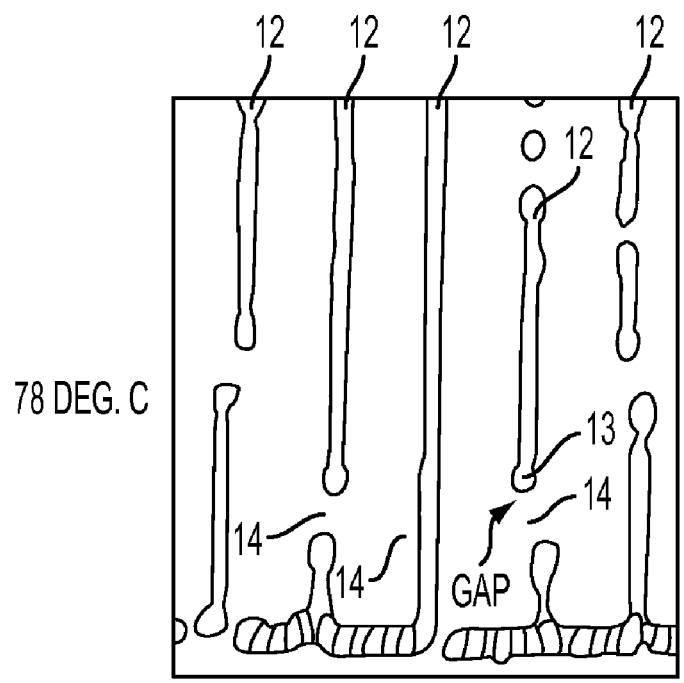
Figure 4C:
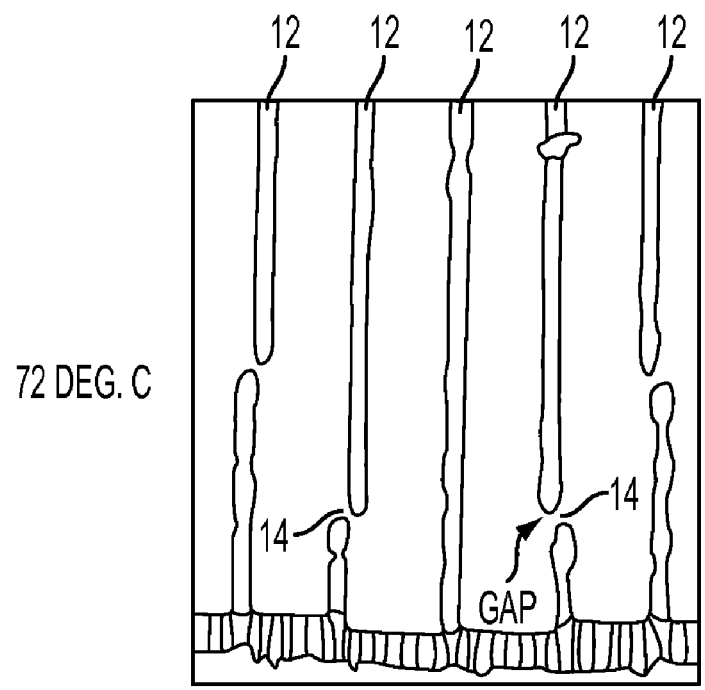
Figure 4D:
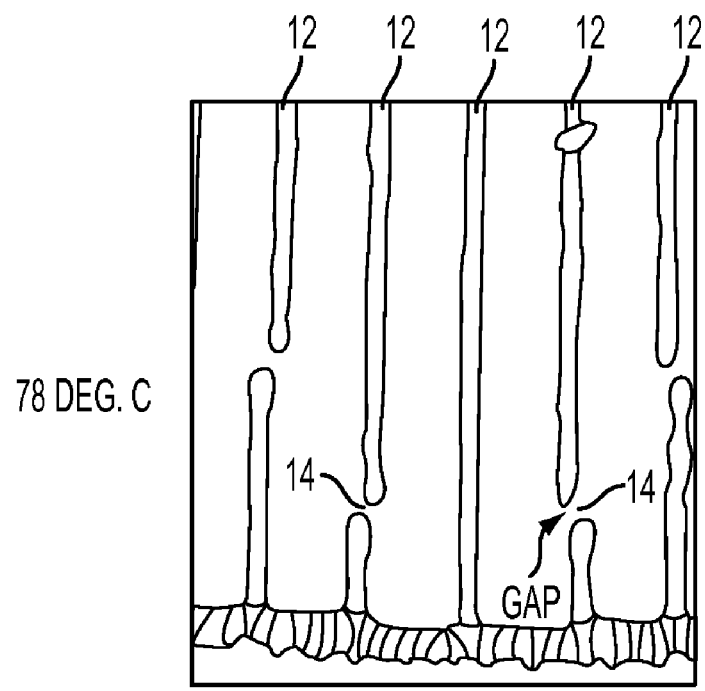

FIGS. 4A and 4B show ink drops 12 deposited on prior art surface 13 at 72° and 78° C. FIGS. 4C and 4D show ink drops with less ink drawback or gaps 14 deposited on etched surface at 72° and 78° C. In FIGS. 4C and 4D, other ink drops deposited on the surfaces 4C and 4D of this invention show improved ink drawback or gaps 14 over the prior art surfaces of FIGS. 4A and 4B.

Table 1 shows the ink drawback comparing prior art surfaces vs. the etched surfaces made by the present invention.

| Surface Temperature (deg. C.) | Gap (microns), Prior Art Surfaces | Gap (microns), Present Invention Surfaces |
|---|---|---|
| 72 | 86 | 35 |
| 78 | 125 | 47 |

Note the substantial differences in the ink drawback which results in significantly better images when the drums prepared by the present invention are used. The ink drawback was measured by the gap, as indicated in FIG. 4A to 4D. The larger the gap, the worse the ink drawback. The gap of 35 microns corresponds to nearly no ink drawback.

In summary, the present invention, in one embodiment, provides a process for the production of an ink receiving surface useful in an imaging system. This embodiment comprises providing a metallic receiving surface, coating said receiving surface with an elastomer having a chemically reactive filler or base mixed therewith, subsequently etching this coated surface with an acid to form thereby a water-soluble salt of the base and water, and finally removing the salt by washing the coated surface with water to provide thereby a texture to the resulting receiving surface. The material of the metallic receiving surface is selected from the group consisting of aluminum, nickel, iron phosphate and mixtures thereof. The elastomer is selected from the group consisting of a fluoroelastomer, poly (tetrafluorethylene), silicone rubber, nitrile butyl rubber, polyurethane elastomer, and combinations and mixtures thereof. The base is selected from the group consisting of MgO, $Ca(OH)_2$, $CaCO_3$, $K_2CO_3$ and mixtures thereof, and the acid is acetic acid. The salt is a salt of MgO, $Ca(OH)_2$, $CaCO_3$ or $K_2CO_3$. The resulting receiving surface has a surface texture having a density of from about $10^4$ to about $10^7$ pits per cm$^2$, a size of from about 0.5 to about 5 microns, a texture depth of from about 0.5 to about 10 microns, and a resulting receiving surface having an average roughness, $R_a$ of from about 0.2 to about 1.5 microns.

More specifically, the present process can be used for the production of a drum useful in ink jet printing. The steps in one embodiment comprise providing a metallic drum with a relatively smooth surface, coating the drum with a material comprising a mixture of an elastomer with a base material, etching the resulting coated surface of the drum with an acid to form thereby a water soluble salt of the base, and removing the salt by washing the coated surface with water to provide thereby a texture to the surface of the drum. The drum as was the receiving surface above described is constructed of a material selected from the group consisting of zinc, nickel, iron composition and mixtures thereof. The elastomer is selected from the group consisting of a fluoroelastomer, poly (tetrafluorethylene), silicone rubber, nitrile butyl rubber, polyurethane elastomer, and combinations and mixtures thereof and the base is selected from the group consisting of MgO, Ca(OH)$_2$, CaCO$_3$, K$_2$CO$_3$ and mixtures thereof. The acid used is acetic acid. The resulting receiving surface has a texture having a density of from about $10^4$ to about $10^7$ pits per cm$^2$, a size of from about 0.5 to about 5 microns, a texture depth of from about 0.5 to about 10 microns, and a resulting receiving surface having an average roughness, $R_a$ of from about 0.2 to about 1.5 microns.

In another embodiment of this invention, a metallic receiving surface or drum is coated with a photoresist layer and a UV mask is placed over the photoresist layer. The mask has pre-determined openings to permit a passage of UV rays therethrough. The photoresist layer comprises a material selected from the group consisting of polymethylmethacrylate and polymethylglutarimide and diazonaphthoquinone/Novolac resin and SU-8 The mask, except for the openings, comprises a material impervious to UV rays such as the following materials for example. After exposure of the mask to UV rays, the photoresist layer and the metallic receiving surface are configured to have openings or pits therethrough that after said etching will correspond to said pre-determined openings in the mask. The process includes subsequently removing the photoresist coating that covers the non-etched areas of the photoresist layer to provide thereby a texture to the metallic receiving surface or drum with the pits.

Specifically, this invention includes processes for the production of a drum useful in ink jet printing. The process comprises providing a metallic drum with a relatively smooth surface wherein the drum is constructed of a material selected from this group consisting of zinc, aluminum, nickel, iron composition and mixtures thereof. The drum is coated with a material selected from the group consisting of a photoresist layer or a material comprising a mixture of an elastomer with a base material. Then the process involves etching the resulting coated surface of the drum with an acid to form thereby a water soluble salt of the base and removing the salt by washing the coated surface with water to provide thereby a texture to the surface of the drum.

In a specific embodiment, the metallic drum is coated only with a photoresist layer. A UV mask is placed over the photoresist layer and the mask has pre-determined openings to permit a passage of UV rays therethrough. The photoresist layer comprises a material selected from the group consisting of polymethylmethacrylate and polymethylglutarimide and diazonaphthoquinone/Novolac resin and SU-8. The mask, except for the openings, comprises a material impervious to UV rays of wavelengths 400 nm or shorter. After exposure of the mask to UV rays, the photoresist layer and the drum surface are configured to have openings or pits therethrough that after etching will correspond to the pre-determined openings and subsequently removing the photoresist coating that covers the non-etched areas of the photoresist layer to provide thereby a texture to the drum or metallic receiving surface with the pits.

In the process, a photoresist or elastomer coating on an aluminum drum is provided as the metallic drum The drum is then coated with the photoresist or with a material selected from the group consisting of a mixture comprising a fluoroelastomer and a base filler of MgO, Ca(OH)$_2$, or CaCO$_3$. Etching the coating with acetic acid forms a water soluble salt of the MgO, Ca(OH)$_2$, or CaCO$_3$. Removing the salt by washing the coated surface with water provides a textured drum surface having a surface with an average roughness, $R_a$ of from about 0.2 to about 1.5 microns, a texture density of about $10^4$ to about $10^7$ pits per cm$^2$, a size of from about 0.5 to about 5 microns, a texture depth of from about 0.5 to about 10 microns.

Also, in an embodiment, a fusing surface structure is provided that is configured to receive an application of a thin film of a release fluid, the surface being a textured receiving surface comprising the following characteristics: (a) an average roughness $R_a$ of from abut 0.2 to about 1.5 microns, (b) a texture density of from about $10^4$ to about $10^7$ pits per cm$^2$, (c) a texture size from about 0.5 to about 5 microns and (d) a texture depth of from about 0.5 to about 10 microns. The receiving surface includes a drum substrate useful in ink jet technology. This drum substrate that is useful in ink jet technology, is configured to prevent or minimize ink drawback and improve ink jet image quality in final prints.

It will be appreciated that variations of the above-disclosed and other features and functions, or alternatives thereof, may be desirably combined into many other different systems or applications. Various presently unforeseen or unanticipated alternatives, modifications, variations, or improvements therein may be subsequently made by those skilled in the art which are also intended to be encompassed by the following claims.

What is claimed is:

1. A method of producing an imaging surface for an imaging system useful for inkjet printing, comprising:
   providing a metallic substrate, the imaging surface comprising the metallic substrate;
   coating said metallic substrate with an elastomer layer having a chemically-reactive filler or base mixed therewith;
   etching said coating with an effective concentration of an acid reactive with the filler or base exposed at the surface of the coating, thereby providing reaction products including water-soluble salt at the surface of the coating; and
   forming pits in the coating surface by washing the surface with an aqueous liquid to remove said reaction products, thereby producing a elastomer coated aluminum drum having a textured surface with an average roughness, Ra, of from about 0.2 to about 1.5 microns, a texture density of about $10^4$ to about $10^7$ pits per cm$^2$, each such pit having an opening of from about 0.5 to about 5 microns, and a depth of from about 0.5 to about 10 microns.

2. The method of claim 1 wherein the metallic substrate is a rigid material selected from the group consisting of aluminum, anodized aluminum, iron phosphate, nickel, copper, zinc, stainless steel, and combinations and mixtures thereof.

3. The method of claim 1 wherein said elastomer is selected from the group consisting of a fluorelastomer, poly (tetrafluorethlylene), silicone rubber, nitrile butyl rubber, polyurethane elastomer, and combinations and mixtures thereof.

4. The method of claim 1 wherein said base is selected from the group consisting of MgO, Ca(OH)$_2$, CaCO$_3$, K$_2$CO$_3$, and combinations and mixtures thereof.

5. The method of claim 1 wherein said acid is selected from the group consisting of acetic acid, phosphoric acid, hydrochloric acid, sulfuric acid, nitric acid, and combinations and mixtures thereof.

6. The method of claim 1 wherein said acid is acetic acid.

7. The method of claim 1 wherein an aluminum drum is provided as said metallic substrate, said coating step comprising coating said drum with a mixture comprising a fluoroelastomer and a base filler, the base filler comprising a material selected from the group consisting of MgO, Ca(OH)$_2$, and CaCO$_3$ and mixtures thereof;

said etching comprising etching said coating with acetic acid to form thereby a water soluble salt of said MgO, Ca(OH)$_2$, or CaCO$_3$; and removing said salt by washing the coating surface with water.

8. A fusing surface structure of an elastomeric coating on an imaging surface comprising a metallic substrate that is configured to receive an application of a thin film of a release fluid, said surface being a pitted surface comprising the following characteristics:

an average roughness, $R_a$, of from about 0.2 to about 1.5 microns;

a texture density of from about $10^4$ to about $10^7$ pits per cm$^2$;

each said pit having an opening of a size from about 0.5 to about 5 microns, and a depth of from about 0.5 to about 10 microns.

* * * * *